US008769461B1

(12) United States Patent
Li et al.

(10) Patent No.: US 8,769,461 B1
(45) Date of Patent: Jul. 1, 2014

(54) REPLICATING A DRIVER OF A NET IN A CIRCUIT DESIGN

(71) Applicant: Xilinx, Inc., San Jose, CA (US)

(72) Inventors: Yau-Tsun S. Li, San Jose, CA (US);
Anup K. Sultania, Sunnyvale, CA (US);
E. Syama Sundara Reddy,
Secunderabad (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/742,179

(22) Filed: Jan. 15, 2013

(51) Int. Cl.
*G06F 17/50* (2006.01)

(52) U.S. Cl.
USPC ........... 716/114; 716/108; 716/111; 716/113; 716/134

(58) Field of Classification Search
USPC ..................... 716/108, 109–115, 132–135
See application file for complete search history.

(56) References Cited

U.S. PATENT DOCUMENTS

| 6,591,411 | B2 * | 7/2003 | Alpert et al. | 716/129 |
|---|---|---|---|---|
| 8,091,057 | B1 * | 1/2012 | Suthar et al. | 716/113 |
| 2007/0300193 | A1 * | 12/2007 | Lillis et al. | 716/3 |
| 2012/0054699 | A1 * | 3/2012 | Cho et al. | 716/102 |
| 2012/0124539 | A1 * | 5/2012 | Alpert et al. | 716/114 |
| 2013/0174104 | A1 * | 7/2013 | Vishweshwara et al. | 716/54 |

OTHER PUBLICATIONS

"Fast Optimal Algorithms for the Minimum Rectilinear Steiner Arborescence Problem", by Kwok-Shing Leung, Jason Cong, IEEE @ 1997.*
Cordova, J. et al., "A Heuristic Algorithm for the Rectilinear Steiner Arborescence Problem", Engineering Optimization, Aug. 17, 1994, pp. 1-8, TR-94-025, URL: http://citeseerx.ist.psu.edu/viewdoc/summary?doi=10.1.1.38.3964.
Rao, S. K. et al., "The Rectilinear Steiner Arborescence problem", Algorithmica, vol. 7, No. 1-6, 1992, 277-288, DOI: 10.1007/BF0175876, Springer, New York, URL: http://dx.doi.org/10.1007/BF01758762.

* cited by examiner

*Primary Examiner* — Nha Nguyen
(74) *Attorney, Agent, or Firm* — LeRoy D. Maunu (57) ABSTRACT

Processing a circuit design for implementation on a target device includes, for a first driver that is a driver of a net having a plurality of loads, selecting a second driver that is a driver of the first driver. A representation of a rectilinear Steiner arborescence (RSA) tree is generated from the second driver and the plurality of loads. The RSA tree includes nodes representative of the plurality of loads and a plurality of Steiner points. A subset of the plurality of Steiner points in the RSA tree is selected for disposing respective replicated instances of the first driver. The respective replicated instances of the first driver are assigned to locations on the target device associated with the subset of Steiner points. The connections from each of the respective replicated instances of the first driver are assigned to a respective subset of the plurality of loads.

16 Claims, 8 Drawing Sheets

REPLICATING A DRIVER OF A NET IN A CIRCUIT DESIGN

FIELD OF THE INVENTION

The disclosure generally relates to replicating drivers in nets of a circuit design.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

The process of implementing a circuit design within a particular integrated circuit (IC), referred to as a target device, typically begins with an architecture description of the circuit design. This description can be specified in a hardware description language (HDL) such as Verilog or VHDL. Most circuit designs have one or more timing requirements that must be observed. The timing requirements can be expressed within the programmatic description of the circuit design or as supplemental information or files accompanying the circuit design.

Electronic Design Automation (EDA) tools can process the circuit design and find an implementation for a given target device that meets the timing requirements. The EDA tool typically converts the HDL description of the circuit design into a gate-level representation of the circuit design. With respect to programmable logic device (PLD) type ICs, such as field programmable gate arrays, the gate level description can be technology mapped to vendor specific structures available within the target device. Elements of the circuit design are assigned to different components of the target device, e.g., lookup tables, flip-flops, and the like.

After technology mapping, delay information for interconnects of the circuit design can be calculated. The delay information for interconnects is effectively an estimation of signal propagation delays within the circuit. Because the circuit design has not yet been placed, this estimation of interconnect delays generally is not considered highly accurate.

The EDA tool then can place the technology mapped circuit design. The various elements of the circuit design, now associated with components of the target device, can be assigned to pre-fabricated sites, or locations, of the target device. The placement task generally can be guided by the delay information available. Connections of the circuit design can be routed to generate a routed circuit design.

Conventional EDA tools often have difficulty in processing signals of the circuit design that are distributed to a large number of load pins. It is often the case that these "high fanout signals" (HF signals or HF nets) contribute to the failure of the EDA tool to determine a satisfactory implementation of the circuit design, e.g., an implementation that conforms to the established timing requirements.

SUMMARY

A method of processing a circuit design for implementation on a target device is provided in one embodiment. For a first driver that is a driver of a net having a plurality of loads, a second driver that is a driver of the first driver is selected. A representation of a rectilinear Steiner arborescence (RSA) tree is generated from the second driver and the plurality of loads. The RSA tree includes nodes representative of the plurality of loads and a plurality of Steiner points. A subset of the plurality of Steiner points in the RSA tree is selected for disposing respective replicated instances of the first driver. The respective replicated instances of the first driver are assigned to locations on the target device associated with the subset of Steiner points. Connections from each of the respective replicated instances of the first driver are assigned to a respective subset of the plurality of loads.

In another embodiment, a circuit is provided for processing a circuit design for implementation on a target device. The circuit includes at least one processor and a memory arrangement coupled to the at least one processor. The memory arrangement is configured with instructions for causing the at least one processor to perform operations including, for a first driver that is a driver of a net having a plurality of loads, selecting a second driver that is a driver of the first driver. A representation of a rectilinear Steiner arborescence (RSA) tree is generated from the second driver and the plurality of loads. The RSA tree includes nodes representative of the plurality of loads and a plurality of Steiner points. A subset of the plurality of Steiner points in the RSA tree is selected for disposing respective replicated instances of the first driver. The respective replicated instances of the first driver are assigned to locations on the target device associated with the subset of Steiner points. Connections from each of the respective replicated instances of the first driver are assigned to a respective subset of the plurality of loads.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

The disclosure relates to optimizing high fanout (HF) nets and/or HF signals of a circuit design. An HF net, as used herein, can refer to any network in which a signal from the same source is provided to a plurality of load pins. In some cases, an HF threshold can be applied such that any signal from a single source or driver that is provided to a number of load pins that exceeds a predetermined number of load pins, e.g., the HF threshold, can be considered an HF net. A signal from a single source that is distributed to a number of load pins exceeding the HF threshold can be referred to as an HF signal.

Typically, an HF signal will be provided to anywhere from tens of load pins to thousands of load pins. It should be appreciated, however, that these are examples and, as such, are not intended to limit the size of an HF net or signal in terms of a lower limit or an upper limit. In other cases, a circuit designer can designate a net or signal as an HF net or HF signal through the association of one or more properties within a programmatic circuit description.

In accordance with the embodiments disclosed herein, an HF net and/or signal within a placed circuit design may be selected for optimization. A most critical driver of the driver of the HF net is selected, and a representation of a rectilinear Steiner arborescence (RSA) tree is generated from the selected driver and the loads of the HF net. The RSA tree includes leaves that are representative of the loads of the HF net and multiple Steiner points. A subset of the Steiner points in the RSA tree are selected, and replicated instances of the driver of the HF net are assigned to locations associated with the selected subset of Steiner points on the target device. Connections from each of the respective replicated instances of the driver are assigned to a respective subset of the loads.

Figure 1:
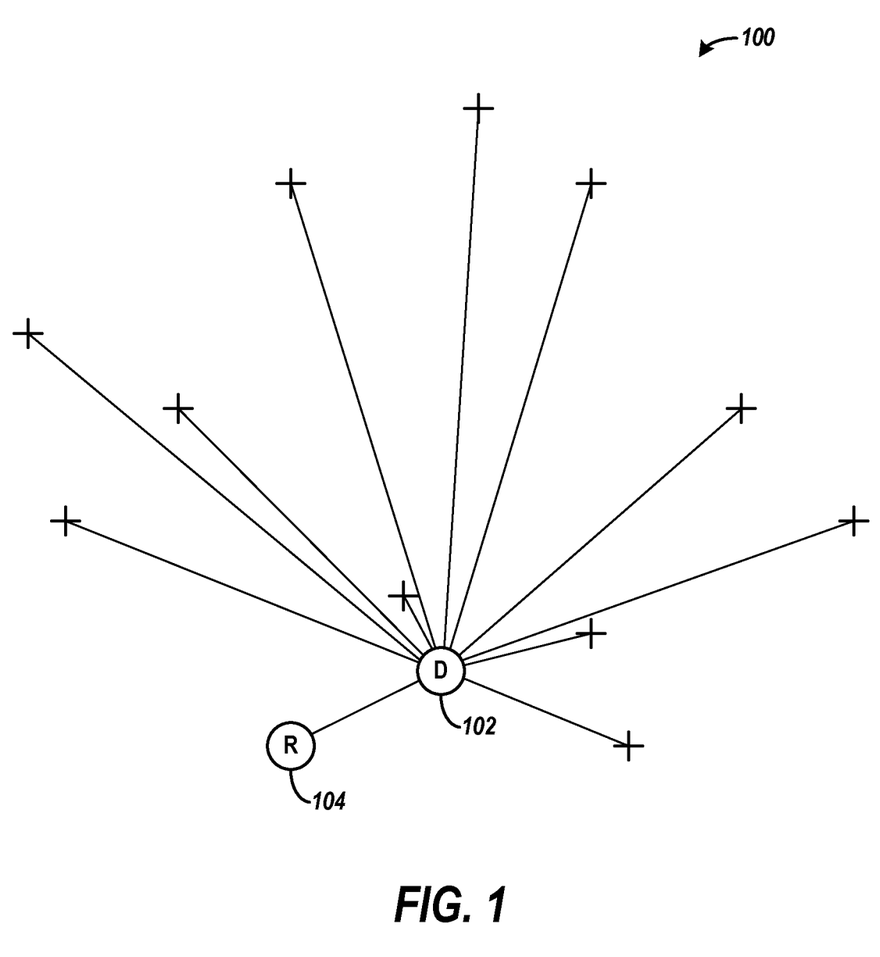
FIG. 1 shows an example of a high-fanout net.

FIG. 1 shows an example of an HF net 100. The HF net includes a driver 102 and a number of loads. Each of the loads is represented with a large "+" symbol. The lines that connect the driver to the loads signify the connections between the driver and the loads. The relative positions of the loads in the drawing correspond to placement of the loads on the target device.

The possible routing paths of the target device may be viewed as a mesh. Using the most critical driver of the driver of the HF net as a root, a shortest path tree that minimizes the number of links used is generated. Constructing the shortest path tree with very good wire sharing (though not necessarily the optimal wire sharing) over a mesh is known as the rectilinear Steiner arborescence (RSA) problem, and the generated tree may be referred to as the Steiner tree or RSA tree. Existing approaches may be used to create the RSA tree. The time complexity for RSA construction is O(n log n) where n is the number of nodes. The path from the root to each leaf of the tree is the minimum Manhattan distance. The RSA tree construction algorithm provides a good heuristic to share the wire resources. The total wire length (WL) of the RSA tree is bounded by twice the WL of the optimal RSA tree. As used herein, wire length refers to the length of a path between two points in the RSA tree.

The most critical driver of the driver is used as the root in generating the RSA tree. The HF net 100 is shown with driver 104 as being the most critical driver of driver 102. Using the most critical driver (critical driver for short) of the driver ensures a shortest half-perimeter wire-length (HPWL) from the critical driver to the leaf instances. This reduces the critical path wire length and improves the worst negative slack (WNS).

The critical driver is the driver of an input to the driver 102 with the least slack. For example, if the driver 102 is an AND gate, the driver of the one of the inputs to the AND gate having the least slack is the critical driver.

Figure 2:
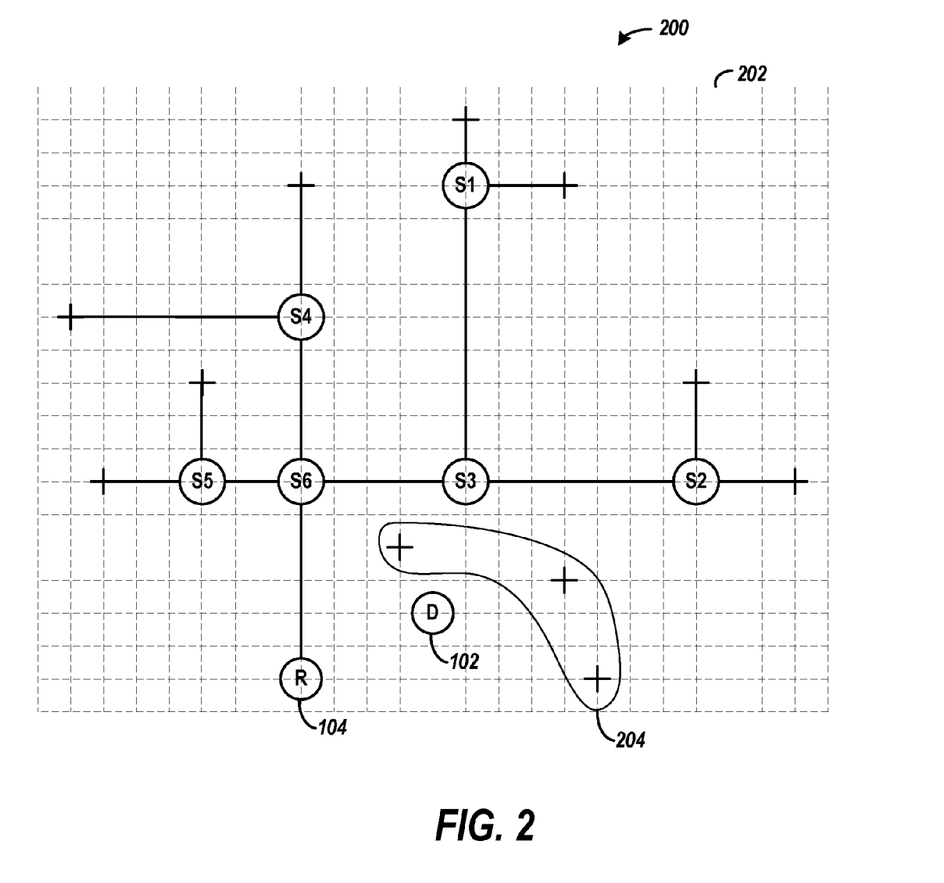
FIG. 2 shows a rectilinear Steiner arborescence (RSA) tree generated from the high-fanout net of FIG. 1.

FIG. 2 shows a rectilinear Steiner arborescence (RSA) tree 200 generated from the high-fanout net of FIG. 1. The drivers 102 and 104 and the loads are at the same positions shown in FIG. 1. Mesh 202 represents wire segments of the target device over which the critical driver, replicated drivers, and loads may be connected. The edge of each square in the mesh corresponds to 1 wire length unit.

The critical driver 104 is connected to the loads via Steiner points S1-S6. Use of the critical driver as the root is important because after fanout optimization, replicated instances of driver 102 will drive some of the loads. If driver 102 were chosen as the root, then after fanout-optimization, the criticality context on which the original RSA was based would be lost. In other words, the original RSA tree would not be valid because there would be many replicated instances of driver 102. By choosing R as the root of the RSA tree, the original RSA tree remains intact after netlist modification because the critical driver 104 remains unchanged.

The loads 204 are not part of the Steiner tree because they are non-critical loads. A load may be designated as non-critical if the slack is greater than a certain threshold value. The loads other than the loads 204 would be critical loads, which are those for which the slack is less than or equal to the threshold.

Since the RSA tree 200 provides optimal routes from the critical driver 104 to the critical loads of the driver 102, replicas of driver 102 are placed at selected points in the RSA tree. All Steiner nodes S1-S6 are candidates for placing the replicas of driver 102. Based on the maximum wire length a replica can drive, appropriate Steiner nodes are chosen for placement of the replica drivers. By replicating the driver 102 and placing the replicas at Steiner points in the RSA tree, the fanouts of the net are reduced, and intermediate points are provided for the router. Both help the router to generate better routes, thereby improving the final worst negative slack.

Figure 3:
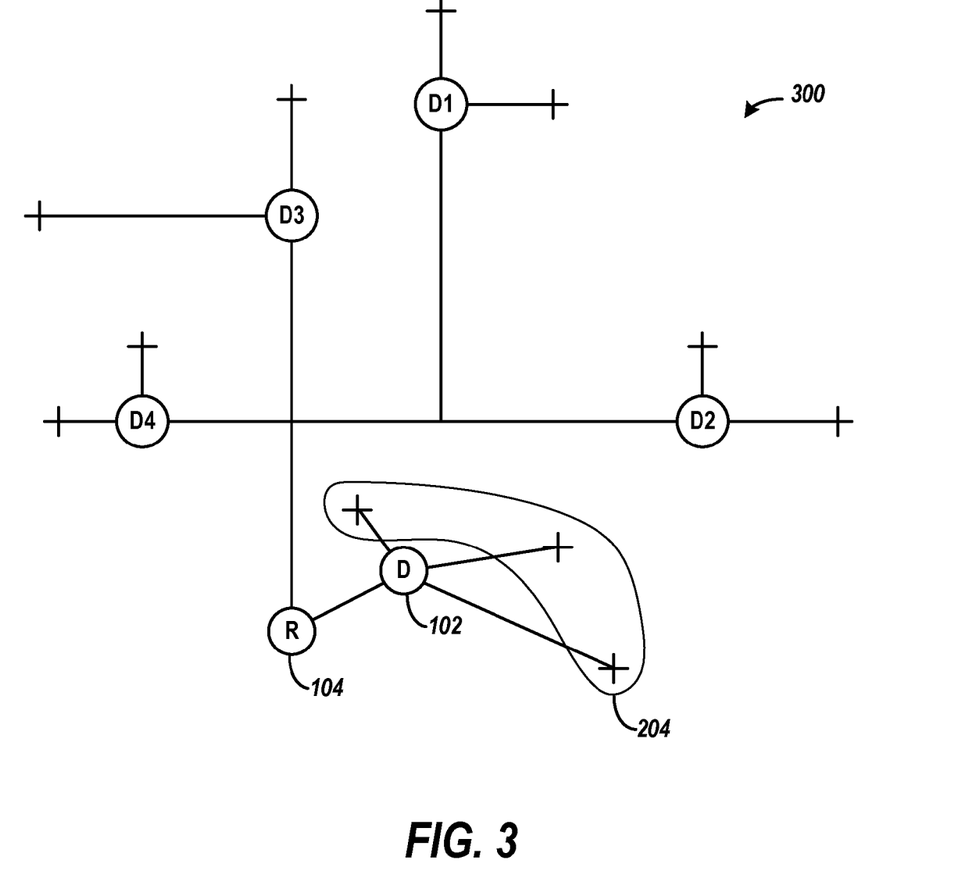
FIG. 3 shows the transformed high-fanout net in which replicated instances of the driver have been placed at selected Steiner points of the RSA tree.

FIG. 3 shows the transformed HF net in which replicated instances of the driver have been placed at selected Steiner points of the RSA tree. Replica drivers D1, D2, D3, and D4 are placed at the positions of Steiner points S1, S2, S4, and S5 (FIG. 2), respectively. The paths of the RSA tree are shown in the net 300 in order to illustrate the signal routes that may be assigned to connect the replica drivers to the loads. The Steiner points S3 and S6 (from FIG. 2) are not shown in order to emphasize the replica drivers. Critical driver 104 may be connected to the replica drivers D1-D4 and the replica drivers D1-D4 connected to the loads via the wire segments that correspond to the paths of the RSA tree from FIG. 2.

The critical driver 104 may be connected to the driver 102 and the driver 102 connected to the non-critical loads 204. However, since the driver 102 and non-critical loads 204 were not part of the RSA tree 200 (FIG. 2), the signal routes would be chosen independent of the RSA tree. The routes are shown as diagonal lines, though the actual signal routes would correspond to the wire segments represented by the mesh of FIG. 2.

Figure 4:
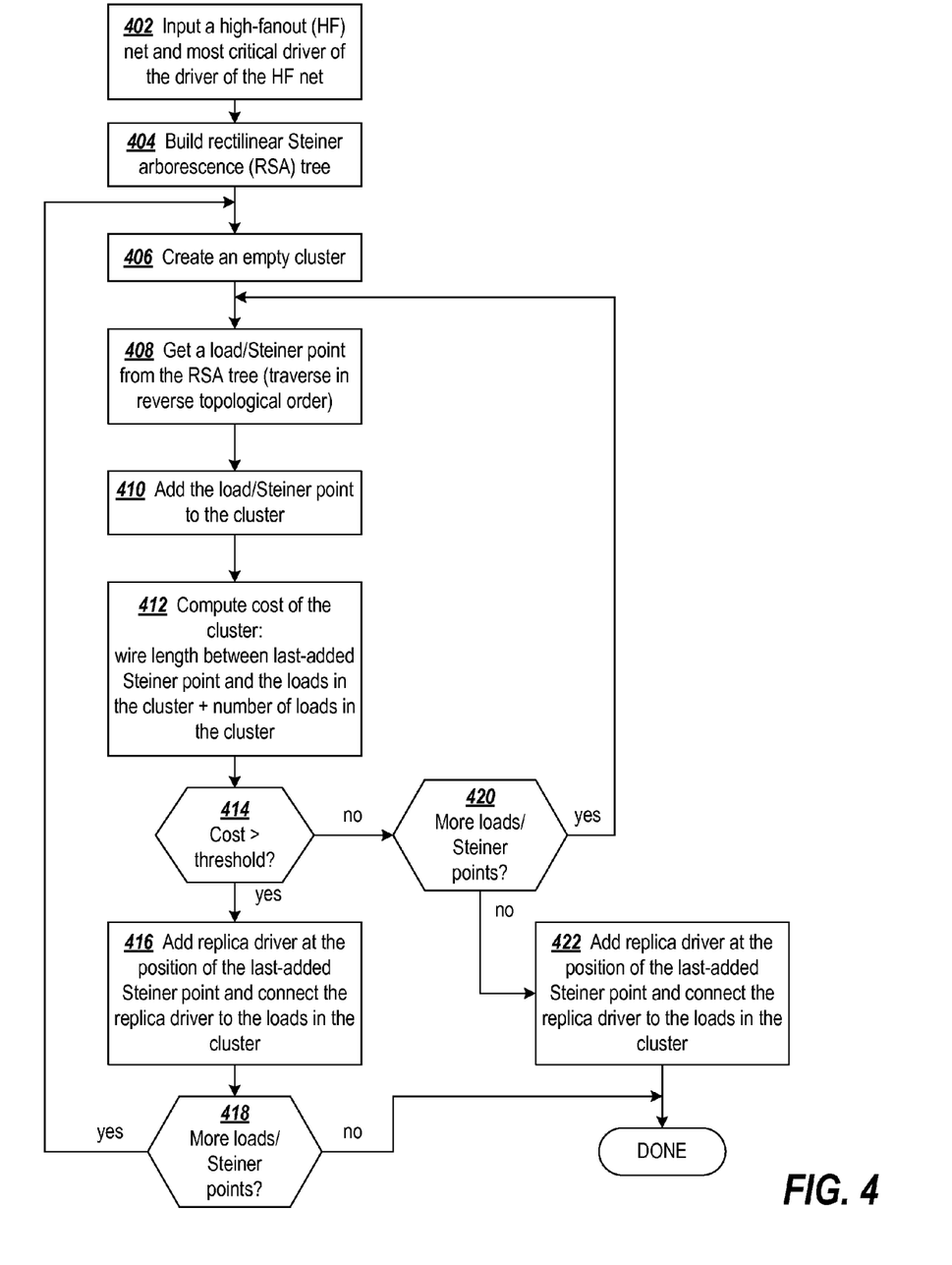
FIG. 4 is a flowchart of a process of optimizing a high-fanout net using an RSA tree.

FIG. 4 is a flowchart of a process of optimizing a high-fanout net using an RSA tree. At block 402, an HF net is input along with the most critical driver of the driver of the HF net. The input includes a specification of the driver of the HF net, the loads/pins that are driven by the driver, and the driver of the most critical pin of the driver of the HF net. An RSA tree is generated at block 404. In generating the RSA tree, the most critical driver of the driver of the HF net is used as the root of the RSA tree.

The process builds clusters of loads and Steiner points in order to determine the positions at which to place the replica drivers. An empty cluster is created at block 406. Each cluster is built by traversing the RSA tree in reverse topological order and adding loads and Steiner points encountered in the traversal until the cost of the cluster exceeds a selected threshold value. The first node obtained from the RSA tree may be the load that is farthest away from the root of the RSA tree. The reverse topological traversal then proceeds to the Steiner point above the load in the RSA tree and continues with any loads that are child nodes of the Steiner point. If there are no child nodes, the traversal moves up the RSA tree to the next Steiner point and continues moving up the RSA tree until the cost of the cluster exceeds the threshold value. Once a cluster is complete, a new empty cluster is created and the traversal again begins at the load that is the farthest from the root and that has not been visited and added to a cluster.

At block 408, a load/Steiner point is obtained from the RSA tree (according to the reverse topological traversal described above), and the load/Steiner point is added to the cluster at block 410. The cost of the cluster with the added load/Steiner point is computed at block 412. The cost function is computed as the total of the wire lengths between the last-added Steiner point and all the loads in the cluster plus the number of loads in the cluster.

The cost of the cluster may be scaled to accommodate a greater number of loads in a cluster in certain scenarios. If more loads can be placed in a cluster, circuit resources may be saved by reducing the number of replica drivers. For target devices such as FPGA, characteristics of the device support scaling the cost. The cost may be scaled since some routing wires are faster than others, some load patterns permit the scaling of the cost, and a common routing resource may be shared by some load patterns.

In some FPGAs, such as those from Xilinx, there are routing wires that are referred to as vertical routing wires and routing wires that are referred to as horizontal routing wires. Vertical and horizontal routing wires run orthogonal to one another, and each vertical routing wire is faster than any of the horizontal routing wires. In recognition of the difference in speed between the vertical and horizontal routing wires, when the cost of a cluster is computed, vertical wire segments that are on the path from the Steiner point to the loads may be assigned a lesser cost value than horizontal wire segments. For example, each vertical wire segment may count as 0.5 units of wire length and each horizontal wire segment may count as 1.0 units of wire length.

Some patterns of loads permit more loads to be placed in a cluster than other patterns. For example, in some FPGAs if there are a number of loads aligned on the same Y-axis of the mesh in the RSA tree, then more loads may be added to the cluster (see FIG. 6). In one example, if there are 4 loads aligned on the same Y-axis, the cost of the cluster may be adjusted to allow more loads to be added. For example, rather than counting each load of the 4 aligned loads as 1 unit of the total cost of the cluster, each load may be counted as 0.5 cost unit.

Figure 6:
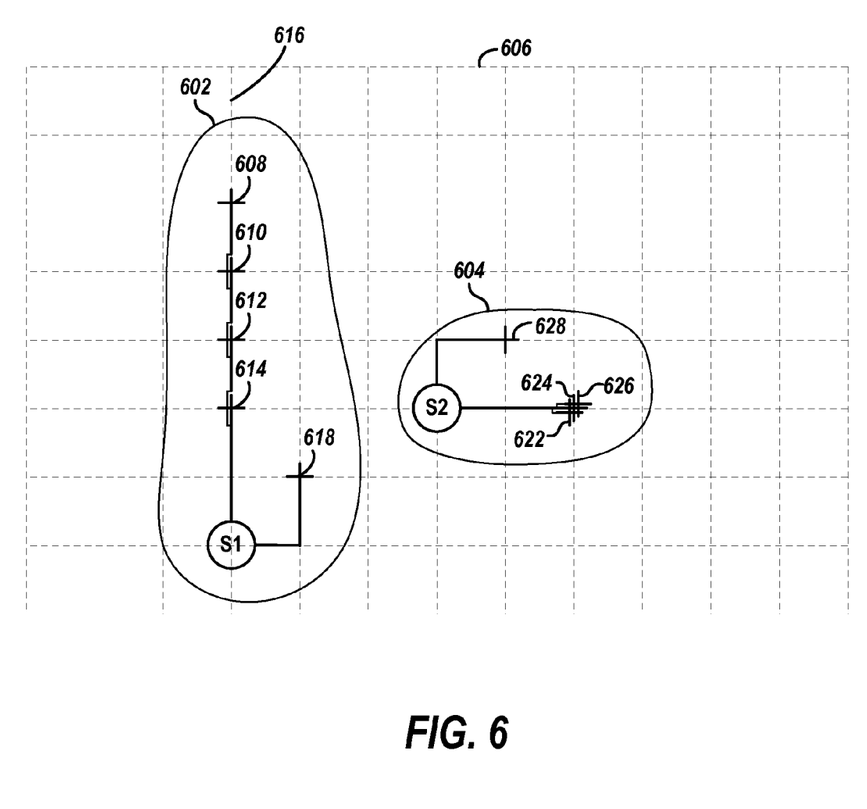
FIG. 6 shows examples of clusters in which the cost threshold has been relaxed.

In another load pattern, multiple loads of a driver may be the inputs of a single configurable logic block (CLB) of an FPGA (see FIG. 6). Since the wire segment(s) may be shared up to the loads, the multiple loads may be treated as a single load in computing the cost of the cluster. For example, if 3 of the loads are the inputs of the same CLB, the cost of the cluster may be adjusted by counting the 3 loads as only one load.

If the cost is greater than a threshold value, decision block 414 directs the process to block 416 where a replica driver is added to the design at the position of the last-added Steiner point and connected to the loads in the cluster. If there are more loads/Steiner points to process, decision block 418 returns the process to block 406 to create another cluster. Otherwise, the processing of the HF net is complete.

If the cost of the cluster is not greater than the threshold, decision block 414 directs the process to decision block 420 to check whether or not there are additional loads/Steiner points to add to the in-process cluster. If so, the process returns to block 408 to obtain the next load/Steiner point from the RSA tree. If there are no more loads/Steiner points to process, at block 422 a replica driver is added to the design at the position of the last-added Steiner point and connected to the loads in the cluster, which completes processing of the HF net.

Figure 5:
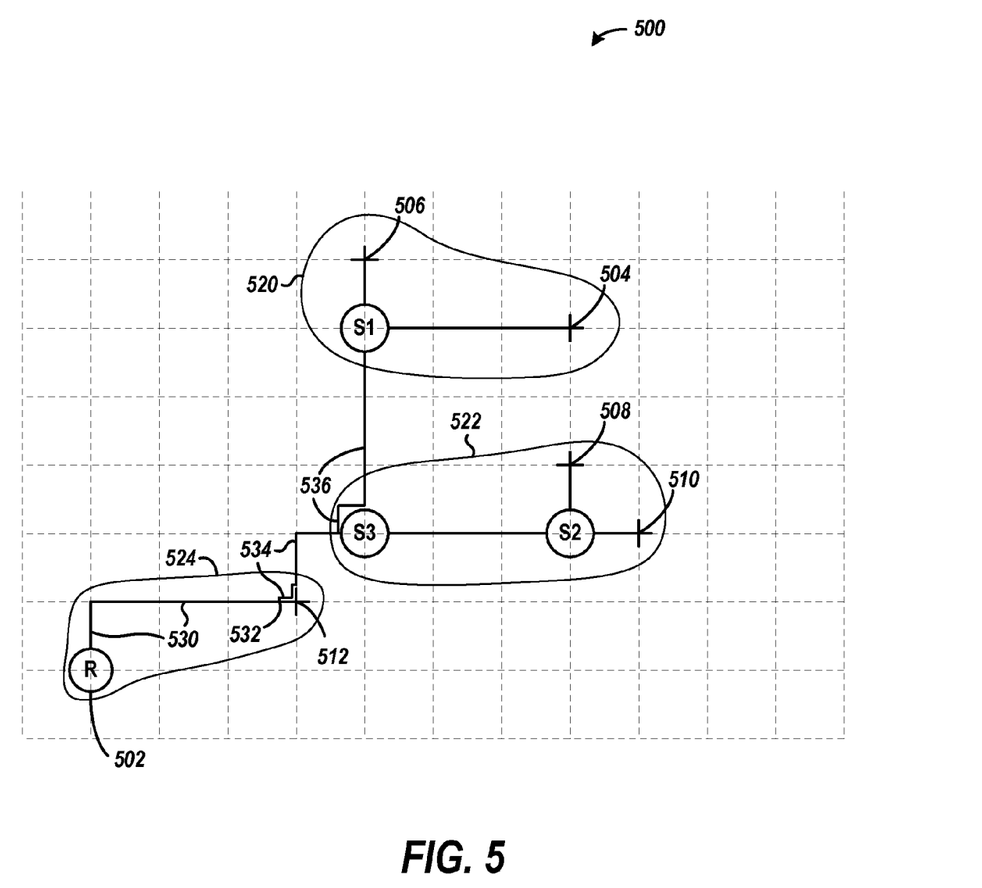
FIG. 5 shows the clusters formed from an RSA tree representation of a high-fanout net.

FIG. 5 shows the clusters formed from an RSA tree 500 representation of a high-fanout net. Critical driver 502 is the root of the RSA tree, and the tree includes Steiner points S1, S2, and S3 along with loads 504, 506, 508, 510, and 512. One unit of wire length corresponds to the side of one square in the mesh, and the example uses a cost threshold value of 5 for completing a cluster.

Load 504 may be considered as the first load in forming a cluster since it is the farthest from the critical driver 502. In forming cluster 520, which begins as an empty cluster as described in FIG. 4, load 504 is added to the cluster. Since there is only one load and no Steiner point in the cluster, the cost of the cluster is 1 after adding load 504. Steiner point S1 is then added to the cluster, and the cost of the cluster is 4 (wire length 3+1 load). Load 506, being a child of Steiner point S1 is next added to the cluster. After adding load 506, the cost of the cluster is 6 (wire length 4+2 loads). Since the cost of cluster 520 now exceeds the threshold cost value (e.g., 5), the cluster is complete and a replica driver may be added to the design at the position of Steiner point S1, which was the Steiner point last added to the cluster. Connections between the critical driver 502 and the replica driver, which was added at Steiner point S1, and connections between the replica driver and the loads 504 and 506 are also added to the design.

Once cluster 520 is complete, the process of FIG. 4 creates a new empty cluster and begins building the cluster by adding the load that is farthest from the critical driver 502. Node 508 may be the first node added to cluster 522. Steiner node S2 is added followed by load 510. The cost of the cluster after adding load 510 is 4 (wire length 2+2 loads). Since the cost is not yet greater than the threshold cost value, Steiner node S3 is added to the cluster. After adding S3, the cost of the cluster is 7 (wire length 5+2 loads). Since the cost of cluster 522 now exceeds the threshold cost value (e.g., 5), the cluster is complete and a replica driver may be added to the design at the position of Steiner point S3, which was the Steiner point last added to the cluster. Connections between the critical driver 502 and the replica driver, which was added at Steiner point S3, and connections between the replica driver and the loads 508 and 510 are also added to the design. The last cluster 524 is created as described above, with connections added to the design between the critical driver 502 and the load 512.

The actual wires that connect the critical driver 502 to the replica drivers at Steiner points S1 and S3 and to the load 512 may or may not follow the solid lines that illustrate the connections in FIG. 5. That is, the router may choose different routes depending on the routing required for other parts of the circuit design.

If the design permits signals to be routed from the critical driver 502 to the load 512 and replica drivers at the Steiner points S1 and S3 via wires that correspond to the solid lines shown in FIG. 5, wire segments may be shared between the different connections. For example, wire segments 530 connect critical driver 502 to load 512 and also form part of the connection to the replica drivers at Steiner points S1 and S3. At node 532, wire segments 534 connect to wire segments 530 for carrying the signal to the replica driver at Steiner point S3. Wire segments 536 similarly connect to wire segments 534 for carrying the signal from the critical driver 502 to the replica driver at the Steiner point S1.

FIG. 6 shows examples of clusters in which the cost threshold has been relaxed. Note that FIG. 6 is not intended to show a complete RSA tree. Rather, FIG. 6 shows portions of an RSA tree. For some target devices, for example FPGAs, the cost threshold may be relaxed in certain scenarios to allow a greater number of loads to be placed in a cluster. If more loads can be placed in a cluster, circuit resources may be saved by reducing the number of replica drivers.

Cluster 602 has loads that are aligned along a single axis, and cluster 604 has multiple loads placed at a single location in the mesh 606. In cluster 602, loads 608, 610, 612, and 614 are aligned on the same Y-axis 616 of the mesh. For an example cost threshold of 5, the alignment of loads 608, 610, 612, and 614 allows load 618 to also be included on the cluster 602 even though the number of loads (5) and the wire length (7) is greater than the cost threshold. The loads 608, 610, 612, and 614 need not be on the same Y-axis as the Steiner point S1 to relax the cost of the cluster.

Cluster 604 has loads 622, 624, and 626 that are placed at the same location in the mesh 606, which may correspond, for example, to the inputs of the same CLB in an FPGA. The loads 622, 624, and 626 may be counted as a single load in computing the cost of the cluster 604, which would permit load 628 to also be included in the cluster.

Figure 7:
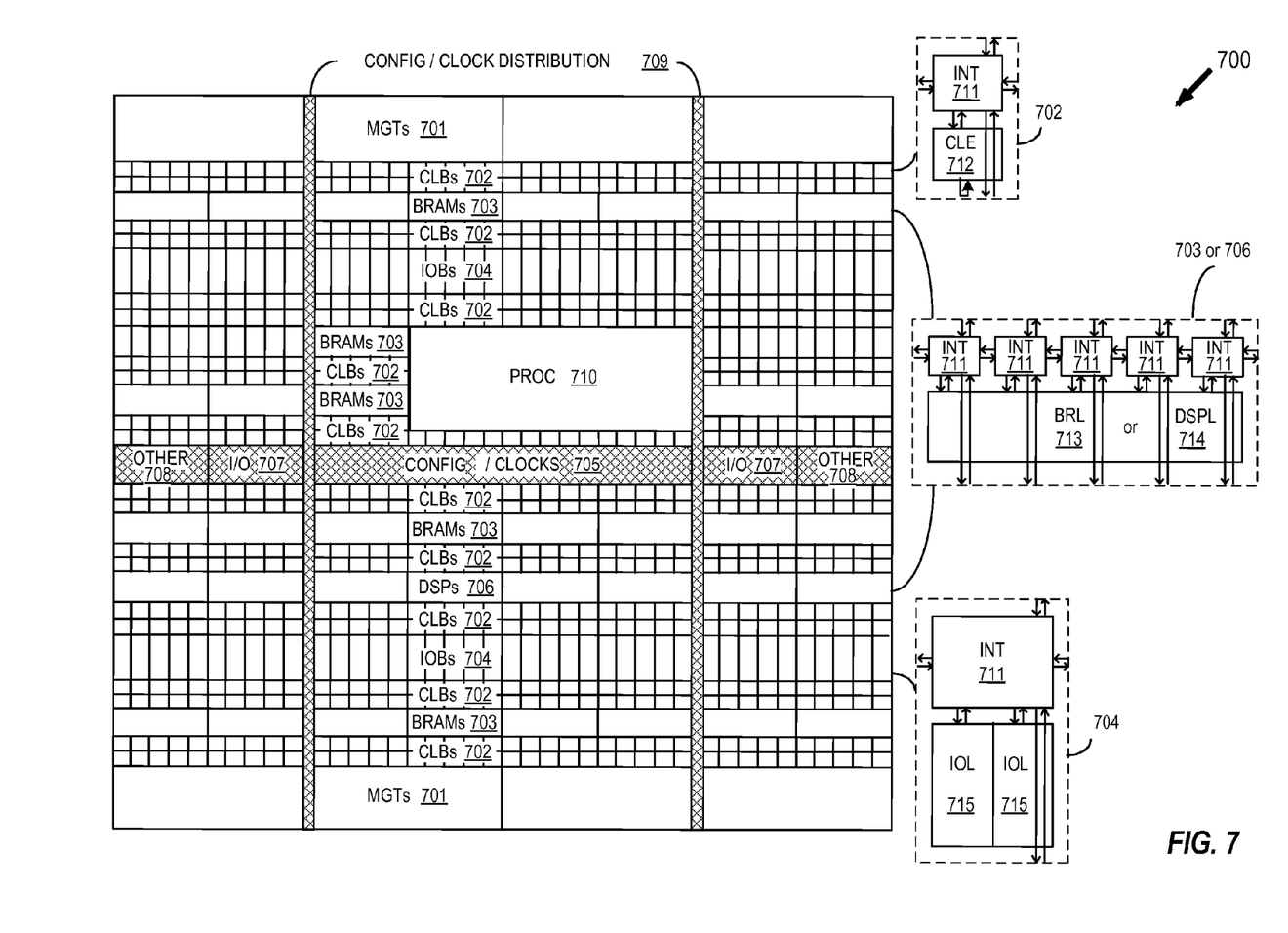
FIG. 7 is a block diagram of an example programmable logic integrated circuit, such as an FPGA, that may be a target device on which a high-fanout net may be implemented.

FIG. 7 is a block diagram of an example programmable logic integrated circuit, such as an FPGA, that may be a target device on which a high-fanout net may be implemented. FPGAs can include several different types of programmable logic blocks in the array. For example, FIG. 7 illustrates an FPGA architecture (700) that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707), for example, e.g., clock ports, and other programmable logic 708 such as digital clock managers, analog-to-digital converters, system monitoring logic, and so forth. Some FPGAs also include dedicated processor blocks (PROC 710) and internal and external reconfiguration ports (not shown).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic plus a single programmable interconnect element INT 711. A BRAM 703 can include a BRAM logic element (BRL 713) in addition to one or more programmable interconnect elements. Typically, the number of interconnect elements included in a tile depends on the height of the tile. In the pictured FPGA, a BRAM tile has the same height as five CLBs, but other numbers (e.g., four) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element INT 711. As will be clear to those of skill in the art, the actual I/O pads connected, for example, to the I/O logic element 715 are manufactured using metal layered above the various illustrated logic blocks, and typically are not confined to the area of the input/output logic element 715.

In the pictured FPGA, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

Figure 8:
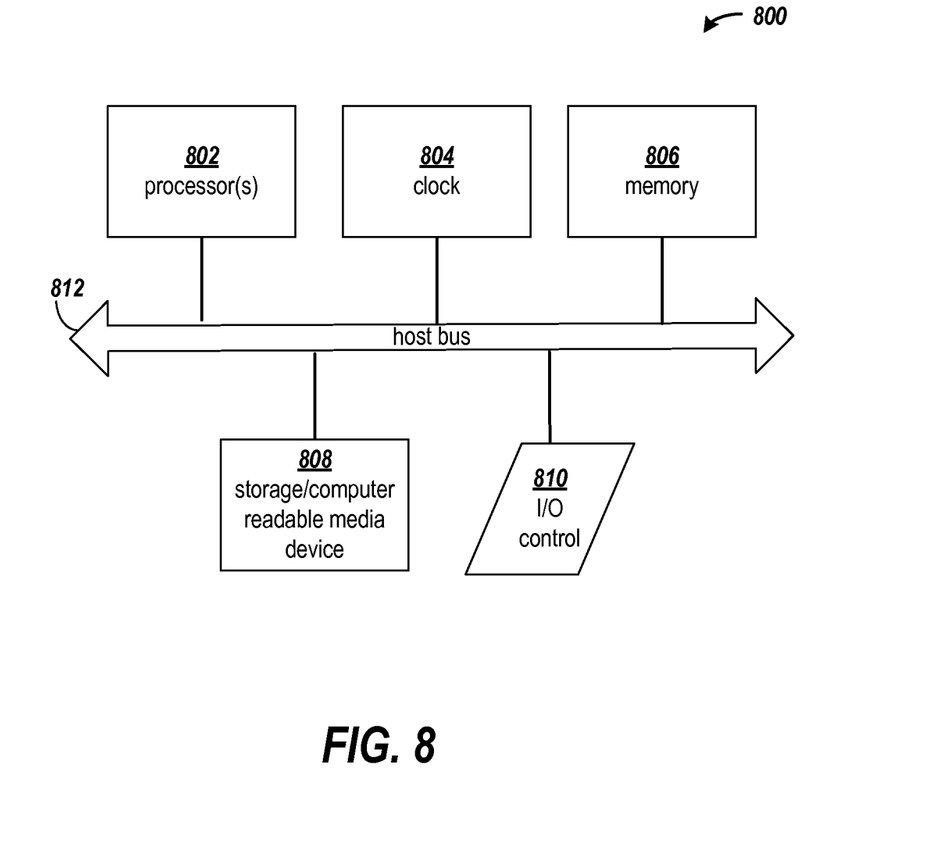
FIG. 8 shows a block diagram of an example computing arrangement that may be configured to implement the data structures and processes described herein.

FIG. 8 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 800 includes one or more processors 802, a clock signal generator 804, a memory arrangement 806, a storage arrangement 808, and an input/output control unit 810, all coupled to a host bus 812. The arrangement 800 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 802 may be one or more general purpose processors, or a combination of one or more general purpose processors and suitable co-processors, or one or more specialized processors (e.g., RISC, CISC, pipelined, etc.).

The memory arrangement 806 typically includes multiple levels of cache memory, and a main memory. The storage arrangement 808 may include local and/or remote persistent storage, such as provided by magnetic disks (not shown), flash, EPROM, or other non-volatile data storage. The storage unit may be read or read/write capable. Further, the memory arrangement 806 and storage arrangement 808 may be combined in a single arrangement.

The processor(s) 802 executes the software in storage arrangement 808 and/or memory arrangement 806, reads data from and stores data to the storage arrangement 808 and/or memory arrangement 806, and communicates with external devices through the input/output control arrangement 810. These functions are synchronized by the clock signal generator 804. The resource of the computing arrangement may be managed by either an operating system (not shown), or a hardware control unit (not shown).

The embodiments are thought to be applicable to a variety of systems for optimizing high-fanout nets. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method of processing a circuit design for implementation on a target device, comprising:
   for a first driver that is a driver of a net having a plurality of loads, selecting a second driver that is a driver of the first driver;
   on a programmed processor generating in a memory, a representation of a rectilinear Steiner arborescence (RSA) tree from the second driver and the plurality of loads, the RSA tree including nodes representative of the plurality of loads and a plurality of Steiner points;
   selecting a subset of the plurality of Steiner points in the RSA tree;
   wherein the selecting the subset of the plurality of Steiner points includes forming a plurality of clusters from the plurality of loads and Steiner points, for each cluster the forming includes adding one or more loads and one or more Steiner points to the cluster until a cost of the cluster satisfies a threshold, the cost is a function of a number of the one or more loads in the cluster and a total wire length between a Steiner point last added to the cluster and the one or more loads, and the Steiner point last added to the cluster is selected for the subset;
   assigning respective replicated instances of the first driver to locations on the target device associated with the subset of Steiner points; and
   assigning connections from each of the respective replicated instances of the first driver to a respective subset of the plurality of loads.

2. The method of claim 1, wherein:
   the target device includes a first set of wire segments and a second set of wire segments, the wire segments in the first set oriented orthogonal to wire segments of the second set, and each wire segment in the first set having less delay than every wire segment in the second set;
   the forming of the plurality of clusters includes:
      determining the total wire length of each cluster as a function of lengths of wire segments of the first set and lengths of wire segments of the second set that connect the one of the subset of the plurality of Steiner points in the cluster to the one or more loads in the cluster; and
      scaling the lengths of wire segments of the first set to compensate for the less delay.

3. The method of claim 1, wherein:
   the target device includes a first set of wire segments and a second set of wire segments, the wire segments in the first set oriented orthogonal to wire segments of the second set, and each wire segment in the first set having less delay than every wire segment in the second set; and
   the adding of the one or more loads and the one or more Steiner points to the cluster includes, for wire segments of the first set between the last-added Steiner point and the one or more loads of the cluster, scaling the lengths of the wire segments of the first set to compensate for the less delay.

4. The method of claim 1, wherein the adding of the one or more loads and the one or more Steiner points to the cluster includes adjusting the cost of the cluster in response to more than a certain number of loads in the cluster being on a single axis of the RSA tree.

5. The method of claim 1, wherein the plurality of Steiner points and loads represent programmable resources of a field programmable gate array (FPGA), and the adding of the one or more loads and the one or more Steiner points to the cluster includes adjusting the cost of the cluster in response to the one or more loads including a plurality of loads at a single configurable logic block of the FPGA.

6. The method of claim 1, wherein the plurality of Steiner points represents programmable resources of a field programmable gate array (FPGA).

7. The method of claim 1, wherein the second driver is a most critical driver of the first driver.

8. The method of claim 1, wherein the plurality of loads include critical loads but not non-critical loads.

9. A circuit for processing a circuit design for implementation on a target device, comprising:
   at least one processor;
   a memory arrangement coupled to the at least one processor, wherein the memory arrangement is configured with instructions for causing the at least one processor to perform operations including:
      for a first driver that is a driver of a net having a plurality of loads, selecting a second driver that is a driver of the first driver;
      generating in a memory, a representation of a rectilinear Steiner arborescence (RSA) tree from the second driver and the plurality of loads, the RSA tree including nodes representative of the plurality of loads and a plurality of Steiner points;
      selecting a subset of the plurality of Steiner points in the RSA tree;
      wherein the selecting the plurality of Steiner points includes forming a plurality of clusters from the plurality of loads and Steiner points, for each cluster the forming includes adding one or more loads and one or more Steiner points to the cluster until a cost of the cluster satisfies a threshold, the cost is a function of a number of the one or more loads in the cluster and a total wire length between a Steiner point last added to the cluster and the one or more loads, and the Steiner point last added to the cluster is selected for the subset;

assigning respective replicated instances of the first driver to locations on the target device associated with the subset of the plurality of Steiner points; and assigning connections from each of the respective replicated instances of the first driver to a respective subset of the plurality of loads.

10. The circuit of claim 9, wherein:

the target device includes a first set of wire segments and a second set of wire segments, the wire segments in the first set oriented orthogonal to wire segments of the second set, and each wire segment in the first set having less delay than every wire segment in the second set;

the forming of the plurality of clusters includes:

determining the total wire length of each cluster as a function of lengths of wire segments of the first set and lengths of wire segments of the second set that connect the one of the subset of the plurality of Steiner points in the cluster to the one or more loads in the cluster; and scaling the lengths of wire segments of the first set to compensate for the less delay.

11. The circuit of claim 9, wherein:

the target device includes a first set of wire segments and a second set of wire segments, the wire segments in the first set oriented orthogonal to wire segments of the second set, and each wire segment in the first set having less delay than every wire segment in the second set; and the adding of the one or more loads and the one or more Steiner points to the cluster includes, for wire segments of the first set between the last-added Steiner point and the one or more loads of the cluster, scaling the lengths of the wire segments of the first set to compensate for the less delay.

12. The circuit of claim 9, wherein the adding of the one or more loads and the one or more Steiner points to the cluster includes adjusting the cost of the cluster in response to more than a certain number of loads in the cluster being on a single axis of the RSA tree.

13. The circuit of claim 9, wherein the plurality of Steiner points and loads represents programmable resources of a field programmable gate array (FPGA), and the adding of the one or more loads and the one or more Steiner points to the cluster includes adjusting the cost of the cluster in response to the one or more loads including a plurality of loads at a single configurable logic block of the FPGA.

14. The circuit of claim 9, wherein the plurality of Steiner points represent programmable resources of a field programmable gate array (FPGA).

15. The circuit of claim 9, wherein the second driver is a most critical driver of the first driver.

16. The circuit of claim 9, wherein the plurality of loads include critical loads but not non-critical loads.

* * * * *